US010717582B1

(12) United States Patent
Goodenough

(10) Patent No.: US 10,717,582 B1
(45) Date of Patent: Jul. 21, 2020

(54) ENCASEMENT WITH A PROTECTIVE SHOCK ABSORBING COMBINATION

(71) Applicant: Troy Goodenough, Mindoro, WI (US)

(72) Inventor: Troy Goodenough, Mindoro, WI (US)

( * ) Notice: Subject to any disclaimer, the term of this patent is extended or adjusted under 35 U.S.C. 154(b) by 47 days.

(21) Appl. No.: 15/731,484

(22) Filed: Jun. 19, 2017

Related U.S. Application Data

(60) Provisional application No. 62/493,044, filed on Jun. 20, 2016.

(51) Int. Cl.
| | | |
|---|---|---|
| *H05K 5/00* | (2006.01) | |
| *C08G 18/48* | (2006.01) | |
| *C08L 75/08* | (2006.01) | |
| *B65D 81/02* | (2006.01) | |
| *A45C 11/00* | (2006.01) | |
| *A45C 13/00* | (2006.01) | |
| *H05K 5/02* | (2006.01) | |
| *C08J 7/04* | (2020.01) | |
| *B29C 45/14* | (2006.01) | |
| *B29K 21/00* | (2006.01) | |
| *B29L 31/34* | (2006.01) | |

(52) U.S. Cl.
CPC ............ *B65D 81/022* (2013.01); *A45C 11/00* (2013.01); *A45C 13/002* (2013.01); *C08J 7/0427* (2020.01); *H05K 5/0217* (2013.01); *A45C 2011/002* (2013.01); *A45C 2011/003* (2013.01); *B29C 45/14336* (2013.01); *B29K 2021/003* (2013.01); *B29L 2031/3481* (2013.01); *C08J 2375/08* (2013.01); *C08J 2400/22* (2013.01); *C08J 2400/26* (2013.01)

(58) Field of Classification Search
CPC ...... B65D 81/02; H05K 5/061; H05K 5/0217; C08J 2375/08; C08J 2400/22; C08J 2400/24; C08J 2400/26; A45C 2011/001; A45C 2011/002; A45C 2011/003; B29K 2021/003; B29K 2021/006; C08L 75/08; C08G 18/4804; C08G 18/4812
See application file for complete search history.

(56) References Cited

U.S. PATENT DOCUMENTS

2004/0254256 A1* 12/2004 Lockwood ......... C08G 18/1833
521/174
2013/0105354 A1* 5/2013 Wyner ............... B65D 81/1275
206/586

* cited by examiner

*Primary Examiner* — Lee E Sanderson
*Assistant Examiner* — Michael C Romanowski
(74) *Attorney, Agent, or Firm* — M. Paul Hendrickson; Bryan R. Rosiejka

(57) ABSTRACT

Protection against impact damage to delicate items stored in a protective encasement such as cell phone cases is significantly improved by protectively lining the interior of a protective encasement with a unique protective combination. This combination includes a protective inlay or insert of a thermoset viscoelastomeric protector in its static form coated with a compatible and non-confining elastomeric polymer coating. Coating the viscoelastomeric protector with the elastomeric coating necessarily requires retention of an undistorted viscoelastomeric protector in its static form during the formative coating procedure. This can be effectively accomplished by injecting coating under low pressure and high solids coating conditions.

23 Claims, 3 Drawing Sheets

ENCASEMENT WITH A PROTECTIVE SHOCK ABSORBING COMBINATION

CROSS-REFERENCE TO RELATED APPLICATION

This application claims the benefit of U.S. Provisional Application No. 62/493,044 filed Jun. 20, 2016, and incorporates by reference herein the provisional application in its entirety.

FIELD OF INVENTION

The present invention relates to protective cases, and more particularly to protective cases for protecting fragile goods such as electronic hardware and the like from impacting forces and methods of its use and manufacture.

BACKGROUND OF INVENTION

It is common practice to provide an auxiliary protective encasement for protecting electronic devices from impact damage. The typical protective case comprises an outer shell housing and an internally disposed elastomeric material placed upon the encasement bed designed to protect the electronic hardware from damaging impacting forces. Typically a shock absorbing protective insert is simply placed in the bed of the case. Normally, the front of the case is open for accessing the electronic device. Although the placement of certain shock absorbent inserts upon the encasement bed provides protection against transverse impact blows, there exists essentially no impact resistance against the more common impact damage caused by sidewise blows. This leaves a housed electronic hardware highly susceptible to damage by incoming sidewise impacting forces.

Not all elastomeric materials possess sufficient shock absorbent efficacy or physical integrity to protect delicate electronic hardware from multidirectional impact damage, or maintain their original structural static characteristics after impact, or have an ability to rebound gently, so as to provide superior damage resistance against a damaging impacting force. Almost all elastomeric materials lack the necessary compression and rebound characteristics to fully protect the most delicate electronic devices against impacting damage. Unfortunately, the more commonly used shock absorbing elastomeric materials provide only unilateral or compressive protection against impacting damage and often tend to become frayed, distorted or disintegrate when exposed to extended use or shocking blows. This problem becomes particularly acute as exemplified by the heretofore futile attempts to protect both the encasement bed and the internal side panels or inner cupped rim perimeters of a protective case with a highly effective thermoset viscoelastomeric protector, especially one susceptible to a confined deformation upon an application of external forces or pressures thereupon under confinement, such as applied by its covering with a plastic film. This problem is further compounded by the fact that a particular class of these viscoelastomeric materials also possesses a high degree of surface tack, leading to unsightly dust and other external contaminants, as well as having an undesirable surface tack feeling to the user. Prior attempts to cover such tacky surfaced, viscoelastomeric shock absorbing polymeric materials with a thin plastic film have been unsuccessful. As a protective barrier, such viscoelastomers fluid flow characteristics poise a particularly difficult challenge. Unlike conventional elastomers, which merely undergo compressive volume reduction upon impact and then decompress, certain of the most highly effective viscoelastomers merely become displaced, without any volumetric change occurring upon receiving a deforming impact. Thus, a slight surface pressure, such as applying a non-tacky film or coating upon the thermoset viscoelastomeric protector, will maintain the protector in its distorted state and prevent its restoration to its indigenous viscoelastomeric configuration (often referred to as "static" configuration). In addition, such trapped distortion also leads to a substantial loss of shock absorbing efficacy. The thermoset viscoelastomers, coupled with their tacky surface, thus tend to cohesively bond with an applied film or coating under a deforming pressure, such that the applied plastic film or coating retains the viscoelastomer in its deformed form and inhibits it from any reconfiguration to its native static form. Unfortunately, it has been virtually impossible to apply a plastic film to certain shock absorbing thermoset viscoelastomeric protectors. This covering problem is especially acute around the inner cornering cupped rims of such protective electronic cases, wherein the viscoelastomeric inlay becomes entrapped, deformed and restrained within the cupped inner rim from rebounding to its unique indigenous or static viscoelastomeric form. The applied covering film restrains and maintains the thermoset viscoelastomer polymeric inlay in its deformed state, thus severely eliminating the full benefit of its indigenous impact force arresting attributes of the thermoset viscoelastomer. Futile attempts to apply plastic films or coatings to the viscoelastomeric inlay have led to an unattractive finished product. As a result, many electronic case manufacturers have simply resorted to placing a tacky viscoelastomeric shock absorbing panel upon the encasement bed, while leaving the peripheral rim area unshielded from a protective film covering. This procedure is less difficult in that the viscoelastomeric inlay is not entrapped in its deformed state, as is the case of applying a film over a channeled inlay.

It would be highly advantageous if it were possible to apply a thin, non-tacky, protective plastic coating over a tacky, deformable, thermoset viscoelastomeric polymeric protector housed within a channeled inner rim of a protective encasement, especially without deleteriously altering the innate shock arresting properties of the inlaid thermoset viscoelastomeric protector.

SUMMARY OF THE INVENTION

The present invention provides a protective encasement combination for housing a fragile item within a protective encasement, which affords substantial resistance against damage to items housed therein when struck by an impacting force. The protective encasement combination provided herein comprises a protective encasement having a peripheral channeled inner rim defining a peripheral side panel margin of the encasement, wherein an internal surface region of the inner rim and/or an encasement bed includes an interfacing, unstressed shock absorbing thermoset viscoelastomeric inlay having a protective elastomeric coating thereupon, with said coating possessing sufficient flexibility to correspondingly respond and rebound to the thermoset viscoelastomeric protector's response to an impacting force.

A major problem associated with the manufacture of the shock absorbing cases arises as to how to protectively cover an inlaid thermoset viscoelastomeric protector without causing any adhesive compressive distortion or deformation of an original unstressed shape and configuration of the inlaid protector. When a substantive extrinsic stressful force is applied during the coating of, or by applying a film to, an entrapped thermoset viscoelastomeric protector (also referred to herein as an "inlay"), the viscoelastomeric inlay tends to become permanently deformed thereby. Permanent distortion of an entrapped viscoelastomeric protector, or inlay, readily arises by any compressive or deforming force exerted upon the inlaid, cohesive, thermoset viscoelastomeric protector, such as by applying a film or coating thereto. Such a procedure results in a cohesive bonding and retention of the applied film and viscoelastomeric inlay in a non-functional distorted form. Attempts to apply a thin plastic sheet or film upon such cohesive thermoset elastomeric inlays, without distorting the indigenous shape and configuration of the elastomeric inlays, have accordingly heretofore been infeasible. Attempts heretofore to simply apply a thin film overlay upon a tacky viscoelastomeric protector have resulted in a substantial and permanent distortion to the thermoset viscoelastomeric protector, with the applied coating maintaining the inlay in its deformed state, and preventing any substantive rebounding of the inlay to its native or static form (as it desirably existed prior to its distortion). The deformation of the viscoelastomeric inlay also seriously affects the aesthetic appeal, as well as seriously impairs the superior shock absorbing attributes of the inlay, as would be normally provided by the thermoset protector in its uncovered, native thermoset viscoelastomeric form.

The embodiments of this invention provide a superior encasement inlay combination possessing exceptionally superior shock absorbing efficacy, including protection against transversely induced impacting shock about the peripheral side panel regions of a protective encasement, while also providing a substantially continuous thin, non-tacky coating serving to maintain the thermoset viscoelastomeric protective inlay in its native or innate non-deformed form (i.e. static form). The viscoelastomeric thermoset protective inlay housed within the encasement includes a relatively thin flexible or elastomeric plastic protective overcoating which preserves the innate viscoelastomeric static structural integrity of the thermoset polymeric protector without causing any substantial alteration or deterioration in the inherent ability of the viscoelastomeric protector to effectively absorb shock. The elastomeric coating is designed to deform and rebound in substantial conformance with the viscoelastomeric protector in response to an impacting blow. Consequently, both the inlaid viscoelastomeric protector and the elastomeric plastic over-coating applied thereto will harmoniously and effectively respond to an externally induced shock force to provide a unique combination which serves to preserve the innate, undistorted, shock absorbing form of the viscoelastomeric protector.

It has been found that the cohesive thermoset viscoelastomeric protector may be effectively covered or coated, provided special preparatory precautions are undertaken to prevent any undesirable and entrapped distortion to the viscoelastomeric protector during the coating thereof with an elastomeric or flexible polymeric material. By carefully regulating the pressure conditions used to coat or cover the thermoset viscoelastomeric protector, it has been unexpectedly discovered that the viscoelastomeric protector, including channeled cornering sections of the inner rim and the bed of a protective encasement, may be successfully effectuated with little (if any) substantive distortion to the static structure of the thermoset viscoelastomeric protector. The plastic coating or covering procedures used herein provides encasement cornering viscoelastomeric inlays and beds without exhibiting any visible separation from, or a distortion of, the thermoset viscoelastomeric protector.

A particularly effective means to accomplish this objective comprises uniformly injecting a liquefied flexible polymeric film-forming material through a multiplicity of orifices under non-deforming pressures in an amount sufficient to uniformly coat the thermoset viscoelastomeric protector surface without causing any substantial viscoelastomeric distortion during the coating thereof. Casting or coating techniques which entail applying the coating through a single or insufficient number of application nozzles at a viscoelastomeric distorting pressure (e.g. causing substantive inlay viscoelastomeric distortion) should be avoided. Effective casting or coating under spray or injection conditions necessitates a sufficient number of casting or coating orifices so as to uniformly dispense a flexible film forming precursor upon the surface of the thermoset viscoelastomeric protector under sufficiently low pressure conditions to prevent any substantial distortion or compression of the thermoset viscoelastomeric protector, while also using a sufficient amount of coating or covering substrate to uniformly coat the thermoset viscoelastomeric protector therewith.

DETAILED DESCRIPTION OF THE INVENTION

Figure 1:
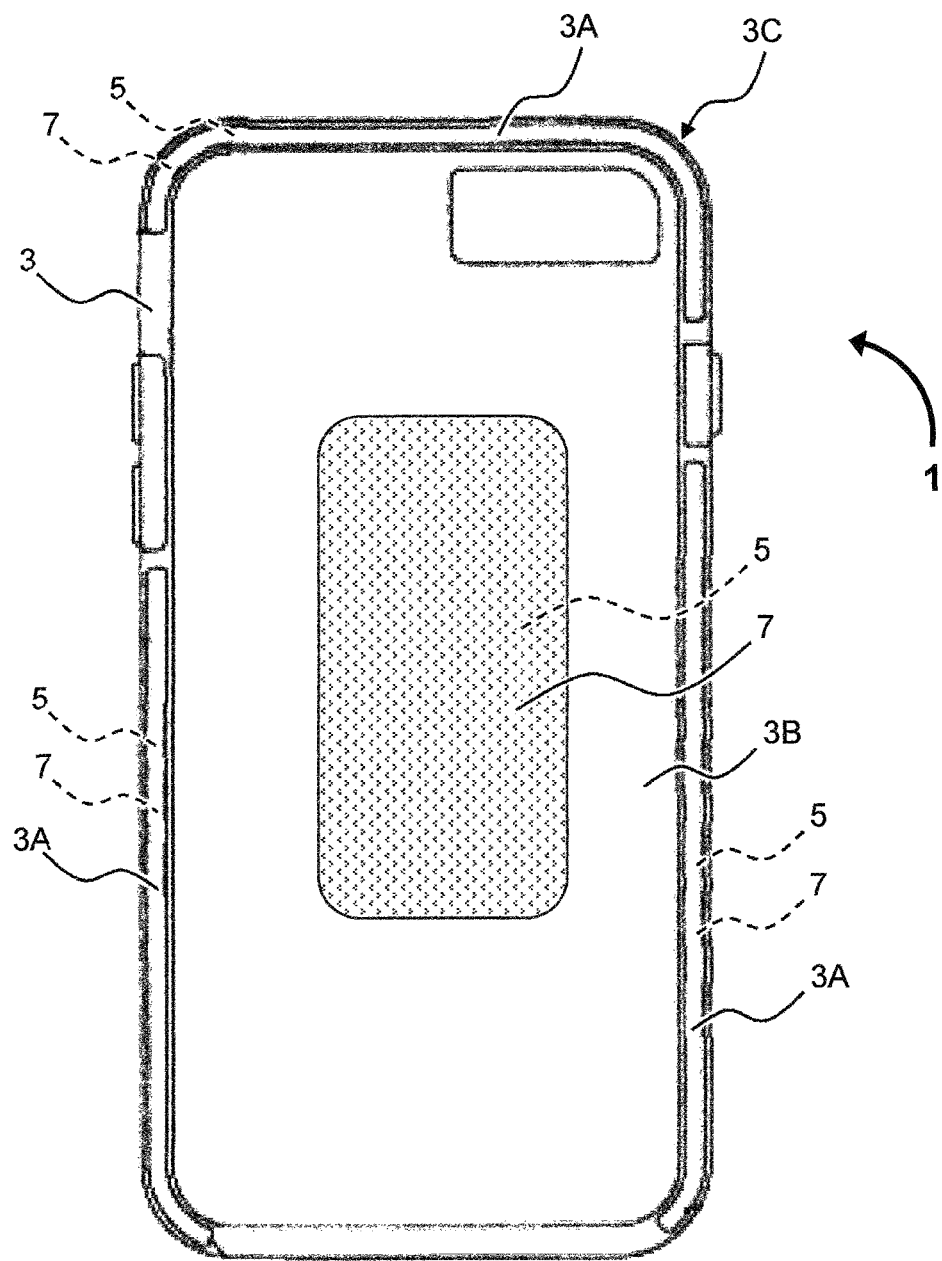
FIG. 1 is a top perspective view of the protective combination of this invention depicting a cell phone case having the shock absorbing thermoset viscoelastomeric protective inlay uniformly seated within a channeled or cupped peripheral rim section of the cell phone case, and coated with a clear elastomeric coating without causing any substantial deformation or distortion of the static configuration of the inlay.
Figure 2:
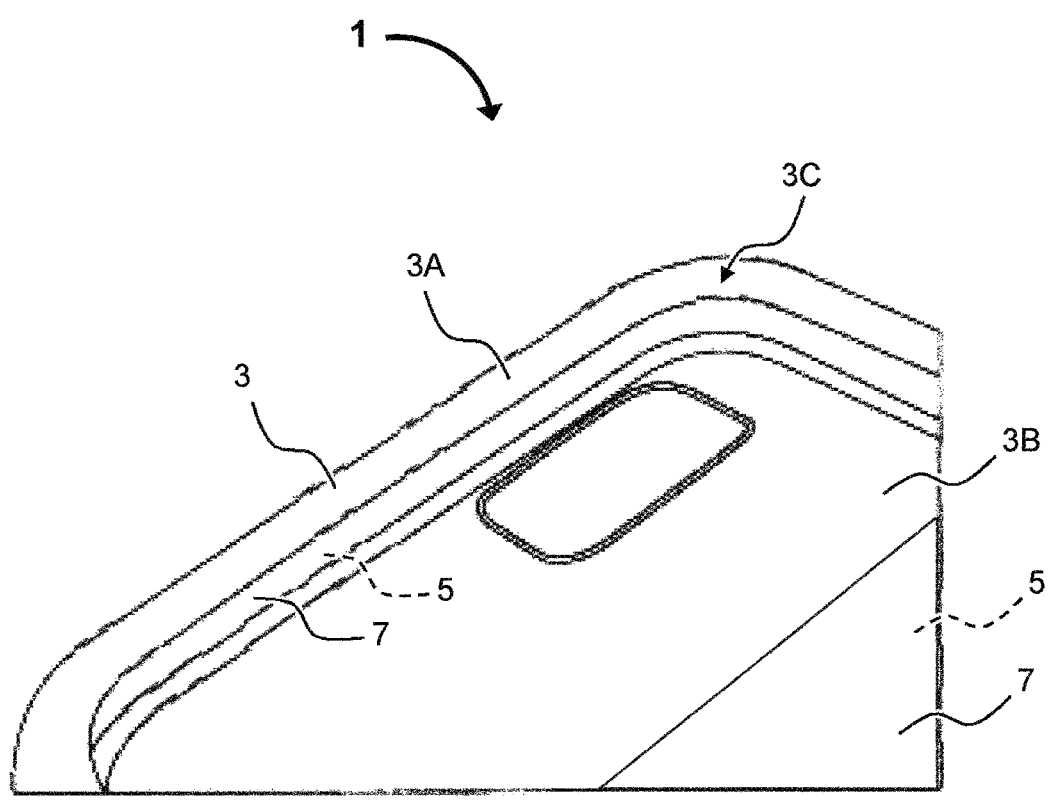
FIG. 2 is a partial perspective view depicting an enlarged cornering edge of FIG. 1 showing an elastomeric coating coated upon the viscoelastomeric protective inlay without any visual deformation of the inlay.
Figure 3:
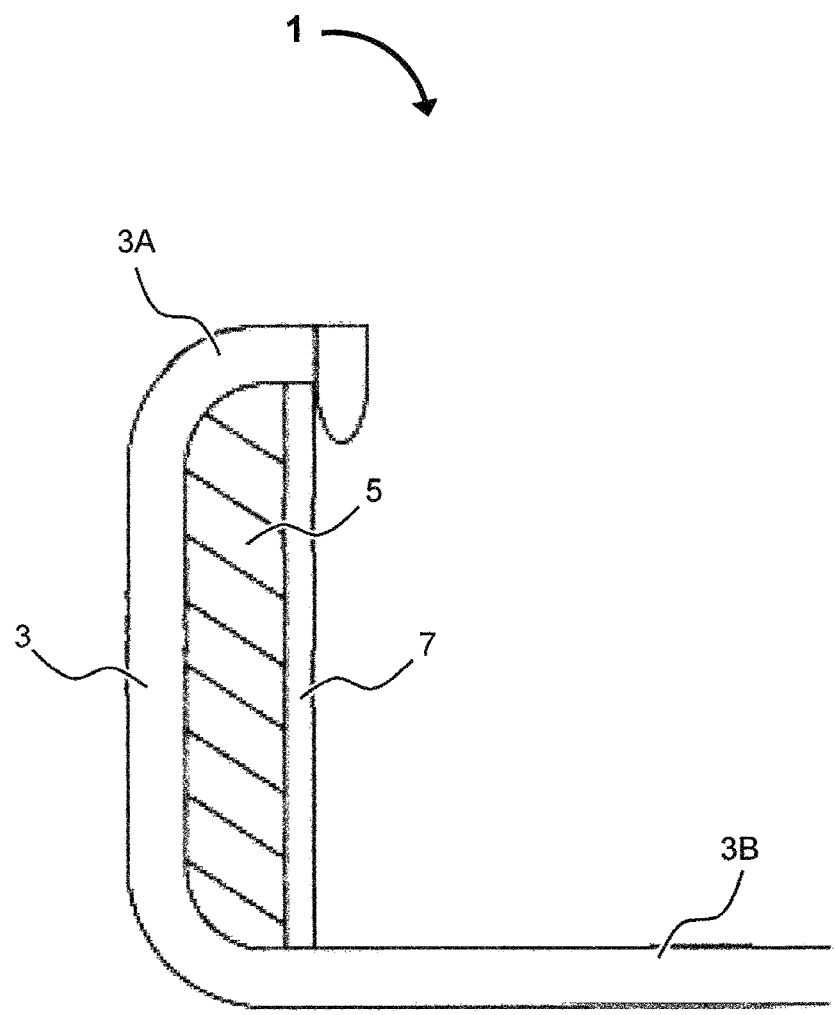
FIG. 3 is an enlarged cross-sectional view of the combination of this invention depicting the interior rim of an encasement equipped with a shock absorbing viscoelastomeric protector protectively coated with an elastomeric polymer coating.

With particular reference to FIGS. 1-3, a protective encasement or case (generally referenced as 3) adapted for the storing of fragile or damageable encased items, such as electronic devices (e.g. touch screen devices, GPS, PC tablets, smart phones, etc.), most typically rely upon a protective housing, which customarily includes an encasement bed 3B, a peripheral sidewall rim enclosure 3A (e.g. cupped or channeled to receive an inlay 5) and an open encasement face for viewing or accessing the electronic device. The thermoset viscoelastomeric protector 5 (also referred to herein as an "inlay") possesses exceptional impact shock resistance for electronic devices housed in open-faced encasements. Unfortunately, its tacky and adhering surface remains highly susceptible to permanent volumetric and shock absorbing changes by attempts to coat the inlay with a non-tacky plastic film under pressurized coating forces. The present invention provides an effective means of covering the thermoset viscoelastomeric protective inlay 5 with a non-tacky plastic overlay without causing any substantive distortion or deformation of the coated protector inlay 5. By not causing any substantive distortion or compression to the thermoset viscoelastomeric protector 5 from its static form, the protective inlay 5, with its protective coating 7, retains substantially all of its desired shock arresting properties of the inlay 5. Thus, the coating process will desirably have no more than a nominal effect upon the impact force-arresting attributes of the thermoset viscoelastomeric protective inlay 5. Whether or not the coating or overlay procedure causes any substantive distortion of the thermoset viscoelastomeric protector 5 may be readily visually observed by the presence of a wrinkled or air pocketed surface, as opposed to a smooth and unwrinkled surface which is indicative of the static form of the coated thermoset viscoelastomeric protector 5. Depending upon the fluid distortion characteristics of the thermoset viscoelastomeric protector 5, the most suitable coating pressure may vary somewhat.

The present invention provides a protective encasement combination 1 for protecting an encased electronic device from shock induced damage, said combination 1 comprising:

A) a protective case 3 for protecting the electronic device therewithin;
B) a static thermoset viscoelastomeric protector 5 internally positioned within the case so as to provide impact protection to the encased electronic device from impacting damage; and
C) a protective flexible polymeric coating 7 possessing sufficient bonding to the protector 5 and flexibility therewith so as to permit a substantially harmonious displacement and rebounding of the coating 7 and the thermoset viscoelastomeric protector 5 upon being struck by an impacting force, and a subsequent rebounding return to the static form of the protector 5.

The combination 1 of this invention permits both the covering film or coating 7 and the viscoelastomeric protector 5 to retain its indigenous or static thermoset viscoelastomeric form while also having the capacity to uniformly undergo a substantial concurrent and harmonious deformation upon being struck by an impacting force and thereafter to rebound to its indigenous or static viscoelastomeric structure after being struck by the impacting force. The invention is particularly applicable to a thermoset viscoelastomeric protector 5 which exhibits uniquely superior fluid flow characteristics upon being struck by an impacting blow. Unlike natural and synthetic rubber shock absorbers which essentially provide only unidirectional shock absorbency and compression, the viscoelastomeric protectors 5 as used herein provide multidirectional shock absorbency by radially dissipating the impacting shock throughout its impact absorbing, protective thermoset viscoelastomeric mass. Amongst such highly effective elastomeric materials for use herein are a class of tacky viscoelastomeric thermoset polymeric materials exhibiting exceptional impacting flow characteristics upon impact, along with low rebound velocity and a high hysteresis, coupled with a capacity to undergo prolonged and repetitive shock and stress strains without incurring any substantial damage or loss to its indigenous viscoelastomeric structure (e.g. a sagging contour or elasticity loss). Although the invention broadly applies to thermoset viscoelastomeric polymers, the combination 1 is particularly well adapted to a particular class of thermoset viscoelastomeric polymeric materials characterized as possessing superior viscoelastomeric shock absorbing characteristics (e.g. low rebound velocity and high hysteresis), along with sufficient adhesive or chemical bonding properties to adhere or bond to the inlay 5 within the inner side panel walls of rim 3A and the encasement bed 3B upon placement therewithin, and thereafter retain its superior static shock absorbing efficacy upon a subsequent exposure to external shock forces (e.g. dropping an encasement which houses a glass paneled touch screen telephone upon a concrete floor from a five foot elevation). In the combination 1, the thermoset viscoelastomeric protector 5 will chemically bond or adhesively adhere to an adhesively compatible protective coating 7 to provide a protective encasement combination wherein both the protector 5 and coating 7 will uniformly respond in unison to deformative impacting forces. If desired, the viscoelastomeric protector 5 may be applied at a desired coating thickness to the encasement bed 3B and the channeled peripheral rim 3A in an uncured thermosetting reaction media form and then allowed to cure in situ to provide the desired cured thermoset inlay 5. This procedure permanently bonds (i.e. chemically) the protector 5 to the encasement 3. This procedure allows the inlay 5 to retain its static form. If desired, the same low pressure and multiple injectors mentioned herein may also be used in applying the inlay 5 to the case 3.

Amongst the most effective thermoset viscoelastomeric protectors 5 for use herein are a particular class of polyurethanes obtained by reacting polyols with diisocyantes or polyisocyanates, such as the aromatic isocyanates (e.g. typically a diphenylmethane diisocyanate (MDI) or toluene diisocyanate (TDI)), aliphatic isocyanates such as hexamethylene diisocyanate (HDI) or isophorone diisocyanate (IPDI) serving as the polyurethane isocyanate reactant. Particularly effective reactant components in preparing the protector 5 include the isocyanate and glycerol prepolymer reacted with diols and triols of polyethers, such as polyoxy alkylene diols and triols (e.g. polyoxyethylene and/or polyoxypropylene diols and triols of about 1000 to about 2000 molecular weight) in the presence of epoxidized vegetable oils.

There exists certain thermoset viscoelastomeric protectors 5 characterized as possessing exceptional shock cushioning and arresting properties which may be prepared under thermosetting reaction conditions using the appropriate thermosetting reactants suitably adapted to provide thermoset viscoelastomeric polymers having the superior shock absorbing properties for use herein. Such thermoset viscoelastomeric protectors 5 may be appropriately prepared by using the appropriate thermosetting viscoelastomeric reactant precursors to provide a carbamate linkage (e.g. urethane linkage) of the cured thermoset polyurethane viscoelastomeric polymeric material. The reaction conditions and reactants are tailored to yield a flexible plasticized thermoset polymeric backbone structure possessing a high degree of impact shock absorbance. In general, a polyurethane thermosetting precursor mix useful herein will typically comprise a plasticizing amount of polyol prepolymers having terminal diol and triol groups reactive with a ring-opening species of a hardener, such as amines, amides, mercaptans, anhydrides or polycyanates, such as an isocyanate. Since the compressive fluid flow and rebounding features of the viscoelastomeric protectors 5 constitutes an essential attribute, the diol or polyol reactants, hardeners, catalyst, reaction temperatures, etc. are suitably pre-selected so as to impart the desired fluid flow cushioning and rebounding (recovery) attributes of the thermoset polymeric protector 5. Because highly exothermic and elevated curing temperatures are more conducive to the formation of excessive cross-linked and more rigid thermosets, the reactants and proportionate amounts thereof are suitably conducted at slower reaction rate catalysis, lower curing temperatures and extended curing times, all of which may be effectively utilized to create the desired degree of polymerizate fluid cushioning and rebounding characteristics. The desired milder reaction conditions used to prepare the thermosets are generally conducive to a more flexible, lower degree of cross-linkage, as well as lower glass transition temperatures.

U.S. Pat. No. 7,041,719 B2 to Matt Kriesel and Troy Goodenough discloses a group of polyurethanes (thermoset) generally classified as thermoset viscoelastomers exhibiting exceptional impact absorbing viscoelastomeric characteristics having low rebound velocity and hysteresis properties for use herein. These thermoset viscoelastomers also exhibit excellent energy attenuating properties capable of withstanding repetitive and prolonged shock stress without incurring any substantive cohesive structural damage, sag or rebound loss. These unique shock absorbing attributes collectively render such thermoset viscoelastomeric protectors 5 particularly useful as shock absorbing components for use as the viscoelastomeric protector 5 herein. The excellent flexibility, fluid flow attributes, compressive deformation without volume loss, and rebounding characteristics of these viscoelastic polymers provide exceptional shock arresting properties for use as a shock absorbing protector.

More specifically, the thermoset polymeric materials which exhibit exceptional properties for use herein may be illustratively prepared by reacting a formulated precursor mix of an epoxidized vegetable oil as a major reactant by weight (typically more than about 50% of the total reactant mixture weight), a combination of polyhydric alkylene oxide materials (e.g. diols and triols) having a molecular weight of greater than 1,000 with an isocyanate prepolymer (e.g. aliphatic, aromatic, heterocyclic, poly, etc., cycloaliphatic, arylaliphatic isocyanates, glycerol prepolymer, etc.), catalyzed by an appropriate amount of slow acting catalyst, to provide a desired thermosetting reaction rate thermoset polymerizate. Illustrative slow curing catalysts include tertiary amines, tertiary phosphines, strong bases (e.g. alkali and alkaline earth metal hydroxides, alkoxides, phenoxides, acidic metal salts of strong acids, metal chelates, metal alcoholates, metal phenolates, organic acid salts, organo metallic derivatives, etc. (e.g. see column 4 line 35-column 5, line 32 of U.S. Pat. No. 7,041,719).

The diols and polyols of a relatively high molecular weight effectively serve as plasticizing polymeric reactants (especially triols) in the resulting thermoset polymerizate. The diols and triols effectively contribute towards the desired flexibility, deformation and rebounding characteristics of the resultant viscoelastomeric polymeric material. The diols are typically comprised of straight chain polyoxyalkelene molecules having two terminal hydroxyl groups, whereas the cross-linking triols characteristically possess three terminal hydroxyl groups for each of the polyoxyalkylene triol molecules. On a reactant weight percentage basis, the triols are generally less effective as a plasticizer than the diols, but nonetheless contribute significantly to the desired end product characteristics. The triol reactant will generally contribute towards cross-linkage and a more highly branched plasticized linkage within the thermoset viscoelastomeric polymerizate. In general, the desired plasticity and flexibility may be imparted via interpolymerizing the higher molecular weight diols or polyols (e.g. molecular weight of about 2,000-10,000) with the other appropriate thermosetting reactants.

The epoxidized vegetable oils especially contribute towards providing the desired cured flexibility, deformation, rebounding and plasticization to the cured thermoset viscoelastomeric protector 5. Particularly effective shock dissipating and arresting efficacy, along with the desired viscoelastic properties, arise when the epoxidized vegetable oil weight ranges between about 45 to about 70 parts by weight of the total reactant weight. Further shock absorbing and arresting efficacy may be obtained when the epoxidized vegetable oil constitutes a major weight portion of the total reactant weight, but typically less than about 70 percent, and most typically less than 60 percent, by weight of the total reactant weight. The molecular size, configuration, polarity, functional molecular groupings, etc., as provided by the epoxidized vegetable oils, significantly contributes towards the desired compression, rebounding and recovery characteristics essential for the inlaid polymeric material 5 herein. Although the epoxidized vegetable oil may include a variety of epoxidized vegetable oils (e.g. castor, corn, cotton seed, perilla, safflower, linseed, soybean, tall, etc.), an epoxidized soybean oil has been found to be especially effective for use as the epoxidized vegetable oil component when preparing the inlaid shock absorbing polymers herein.

Imparting the desired flexibility, deformation and rebounding characteristics for the viscoelastic polymeric material herein may be illustratively effectuated by the thermoset curing of a polyurethane thermosetting precursor mix containing about 6 percent to about 12 percent by weight diol (e.g. ELASTOCAST C-4057, a two hydroxyl functional polyether polyol, available from BASF Corporation), about 20 percent to about 40 percent by weight triol (e.g. ELASTOCAST C-4018, a three functional polyether polyol, available from BASF Corporation), about 5 percent to about 8 percent by weight of methylene diphenyl isocyanate based polyether prepolymer (e.g. ELASTOCAST TQZ-P23, available from BASF Corporation), about 45 percent to about 70 percent by weight of an epoxidized soybean oil, from about 0 percent to about 10 percent by weight of a refined bleached soybean oil, and a cocatalyst comprising a combination of a dioctyltin (e.g. COTIN 430, available from Vertellus Holdings LLC) and a Bismuth (3+) neodecanoate (e.g. COSCAT 83, available from Vertellus Holdings LLC) at a combined catalytic concentration ranging from about 0.1 percent to about 0.6 percent by weight of the total reactant weight. Although the aforementioned percents by weight are referenced to specify commercial products, these proportionate amounts generally broadly apply to a class of reactants compositionally possessing similar or equivalent properties and functionality. Examples of other suitable isocyanate reactants include prepolymers of methylene diphenylisocyanate reacted with polyoxyethlene and/or polyoxypropylene diols of a molecular weight ranging from 1000 to 2000, such as is sold under the Isonate 2181° and Rubinate 1790° trademarks. As a reactant for the viscoelastomeric inlay 5 herein, the epoxidized vegetable oils (especially epoxidized soybean oil) are particularly effective as a polymerizate reactant in producing a highly desirable shock arresting viscoelastomeric material herein. The epoxidized triglycerides of the vegetable oil have been found to uniquely contribute towards the desired prerequisite viscoelastic properties (i.e. highly desirable shock arresting compression and rebounding characteristics) for use in the encasement combination 1 herein.

A number of different procedures may be effectively utilized to apply the thermoset viscoelastomeric protective inlay 5 to the internal surface areas of the encasement 3, including the inner peripheral margin of the encasement rim 3A. The inlaying process is generally accomplished by placing or depositing the inlay 5 in an open-faced encasement region which does not entrap and constrain the inlay 5 in a deformed state. The uncured thermosetting polymeric reactants may be typically prepared by mixing together the aforementioned thermosetting viscoelastomeric precursors under thermosetting conditions which allow for subsequent curing of the thermosetting mix for use as the inlay herein. The viscosity of the precursors may be appropriately adjusted during its setting stages so as to allow for effective working, injection or molding of the viscous curing reactants to a desired end product inlay 5 configuration. The initial viscosity may also be adjusted so as to provide a workable viscosity to allow for injection molding or direct application of the uncured precursors to the inner rim 3A or the entire encasement 3. Another manufacturing technique for preparing the elastomeric material inlay 5 may simply entail allowing the viscoelastomeric inlay 5 to fully cure in a strip or sheet form, such as by depositing uncured precursor reactants at a sufficiently flowable viscosity to allow the uncured reactants to flow into an uncured sheet form of a desired uniform cured thickness, which then, after proper curing, may be cut into appropriate inlay-sized strips for placement onto the inner encasement rim 3A and bed 3B.

Alternatively, the thermoset polymeric protector 5, having the shape and configuration for placement within the inner peripheral rim margin 3A and/or onto the bed 3B of the encasement 3, may be separately calendared or molded and then directly applied to the encasement 3. Since the thermoset viscoelastomeric protector 5 will generally possess sufficient tack to adhere to the inner surface areas of the encasement 3, the molded inlay 5 of the thermoset viscoelastomeric protector may be readily secured and adhesively retained by the inner encasement 3 surface areas. This may be accomplished by applying a sufficient pressure to cohesively adhere the thermoset viscoelastomeric protector 5 thereto. Injection molding of an uncured thermosetting protector inlay reaction mix onto the inner rim 3A and/or bed 3B may also be used to provide the inlaid thermoset viscoelastomeric protector 5 to the inner upper rim of the encasement 3.

Since the thermoset viscoelastomeric protector 5 affords extraordinary impact force arresting efficacy, a relatively thin protector 5 measuring 20 mil or less in thickness will surprisingly afford sufficient impact force arresting attributes so as to protect impact prone, damageable electronic devices (e.g. ultra-thin cell phones) housed within the protective encasement combination 1. The most appropriate dimensional size of the thermoset viscoelastomeric protector 5 depends largely upon encasement interior dimensions and the degree of protection required by the encased electronic item. Due to the extraordinary impact arresting efficacy of the protective inlays 5, effective protection of electronic devices may be easily effectuated through the use of protective inlays 5 measuring from about 10 mil to about 60 mil in thickness. More commonly, the protective inlay 5 will measure from about 25 mil to about 50 mil, and most typically from about 35 mil to about 45 mil in thickness. There is no maximum limit to the thickness of the thermoset polymeric protector 5. However, a thicker thermoset viscoelastomeric protector 5 will add unnecessary bulk, and will generally increase costs without providing any additional benefit against impact-damaging forces. As illustrated by FIG. 1, the entire inner rim 3 need not be inlaid with an inlay 5, since placement at critical potential impacting sites will provide adequate protection.

The installation or placement of the overlaying polymeric coating 7 upon the inlaid thermoset viscoelastomeric protector 5 necessitates special precautions to be undertaken so as to prevent the creation of any substantial distortion or deformation of the protector 5 while applying the coating 7 thereto. These precautions necessitate avoidance of any coating or covering application which typically creates any substantive distortion, deformation or deforming pressure upon the protector 5 while affixing the overlaying coating 7 thereto. Since the most effective thermoset viscoelastomeric protector 5 possesses a tacky surface which readily adheres to suitable flexible coatings, any excessive distorting pressure upon an entrapped protector 5 which may be applied during the coating or application of a plastic overlay 7 thereto will invariably result in an irreversible volumetric distortion of the thermoset viscoelastomeric inlay 5. Coating inlay distortions are basically caused by an adhesive bonding between the applied overlaying coating or film 7 and the entrapped thermoset viscoelastomeric protector 5 which collectively, under excessive distorting pressures, retain the distorted cohesive and entrapped protector 5 in a distorted, ineffective, non-static shock absorbing form. It has been observed that deformations resulting from deforming coating or covering procedures involving applying a plastic covering or coating under excessive or uneven pressure will inherently persist within the cohesively deformed protector 5 after the coating or inlay covering step has been completed. The applied coating or overlay 7, if not properly applied, will accordingly tend to permanently alter the native viscoelastomeric state, the fluid shock absorption and the rebounding characteristics (i.e. static viscoelastomeric properties) of the inlaid thermoset viscoelastomeric protector 5. To avoid any adhesive and cohesive distortion of the viscoelastomeric inlay 5, the overlaying coating or covering 7 should therefore be appropriately applied using relatively gentle coating or covering techniques so as to avoid any substantive thermoset viscoelastomeric protector 5 deformation during the coating or covering thereof.

The overlaying polymeric coating or covering 7 of the inlaid thermoset viscoelastomeric protector 5 thus necessitates application techniques which do not create any substantial pressurized distortion or deformation of the thermoset viscoelastomeric protector 5 during the coating thereof, especially under conditions wherein the protector 5 is entrapped during the overlaying process. The delicacy of coating the protector 5 is well illustrated by early unsuccessful attempts to manually apply thin plastic film strips over the inlaid thermoset polymeric protector 5, or by spray coating under normal spraying conditions, all of which techniques invariably resulted in a pressurized deformation and a distortion of the film 7 covered protective inlay 5. This distortion is especially visible about the corner sections of the inner rim 3A, with the entrapped distorted protector being held in a deformed condition by the overlay. However, it has been unexpectedly found that by applying a polymeric coating material (typically a molten thermoplastic) upon the inlays 5, including the corner sections of the concaved rim 3A, under low atomizing application pressures and high coating material volumes, there exists only a minimal degree of physical deformation of the thermoset elastomeric protector inlay 5 and the uniform coating 7. Visually, there does not exist any substantive distortion of the protective inlay 5.

A suitable method for preparing the protective encasement combination 1 of this invention may initially entail preparing the thermoset viscoelastomeric protector inlay 5 in thin sheet or film form, sized to mate into the cup-shaped inner rim 3A of the encasement 3. The viscoelastomeric film, which may desirably be slightly undersized, is then seated within the internal surface areas of the encasement inner rim 3A. The inner encasement rim 3A, seated with the thermoset viscoelastomeric protector inlay 5, is thereby ready for applying a thin protective coating thereupon under minimal and non-disruptive pressure conditions. The injection or coating applications for applying the polymeric coating necessitate a sufficiently low pressure at a coating solids content sufficient to provide a uniform polymeric coating 7 upon the thermoset viscoelastomeric protector 5 without effectuating a substantive deformation (e.g. nominal) of protector 5. Conventional application techniques, such as by use of a single injection or spray orifice for applying a high solids polymeric coating material at excessive pressure conditions, will inherently result in a substantial deformation of the viscoelastomeric protector 5, which in turn results in unsightly cornering edges and a non-uniform polymeric coating 7 upon the partially deformed protector 5. This problem may be effectively alleviated by utilizing a sufficient number of nozzles or orifices of a sufficient size and distribution so as to create a substantially uniform spray pattern controllably applied at a sufficiently low pressure so as to deposit a substantially uniform polymeric coating 7 upon the viscoelastomeric protector 5 without causing any visible or substantive deformation of the coated inlay 5, including about the cornering inlay sections SC.

By applying the coating under sufficiently low pressure conditions (i.e., sufficient to prevent a substantive volumetric displacement of the static thermoset viscoelastomeric protector inlay 5) within the concave inner rim 3A, the aesthetics and superior shock absorbing attributes of the protective inlay 5 will be preserved while covering its tacky surface. A low pressure injection molding device specifically designed to coat the protective inlay 5 to a desired protective plastic coating 7 thickness may be used for this purpose. The low pressure injection molding may utilize an injection molding sized to circumscribe the entire inlaid protector 5 (including the bed 3B and inner rim 3A) with sufficient clearance to create an inlay coating 7 of the desired coating thickness. The injection mold used to apply the coating 7 will include a sufficient number of injection nozzles having a sufficient number of small sized injection orifices so as to avoid deformation of the protective inlay 5 while applying the molten inlay elastomeric coating 7. Typically, by providing an injection mold having about 2 to about 4 injection nozzles per lineal inch (e.g. 4-16 per square inch) at a sufficient flow pressure to prevent any substantive deformation of the protector 5 will accomplish this objective. Injection pressures are typically below 400 pounds per square inch (psi), more typically below 200 psi, and most typically from about 100 psi to about 150 psi. A visual inspection of the coated inlay will readily reveal whether or not the coating pressure is appropriate.

A highly effective technique for applying the protective coating 7 to the thermoset viscoelastomeric protector 5 involves the use of low pressure injection molding equipment to apply the protective coating 7. A particular satisfactory coating technique involves using a normally solid commercially available thermoplastic elastomer (commonly referred to as TPE), which may be melted to provide an injection moldable mass, and then injection molding the molten elastomeric thermoplastic onto the protector 5 under sufficiently low injection pressures through multiple injection nozzles of a non-deforming spray pattern, so as to effectively retain the static form or state of the thermoset viscoelastomeric protector 5 (i.e. the substantially resting form, undistorted, without deformation). This may be effectively accomplished by creating an equalized manifold pressure for the injection molding step through the use of a sufficient number of injection spray nozzles under equalized pressure and sized to coat the thermoset viscoelastomeric protector 5 without causing any substantial deforming distortion thereof. In this procedure, it is generally necessary to use a sufficient number of injection orifices sized to ensure that the coating spray of the elastomeric material does not cause any substantive distortion of the thermoset polymeric protector 5. In applying the coating 7, the injection mold cavity and the applied injection coating 7 are slightly oversized so as to circumscribe the molded thermoset protector 5 without deforming the molded thermoset protector 5, thereby providing a relatively thin protective coating thereupon. Pressure equalizing manifolds may be effectively used to ensure that the low nozzle pressure application remains relatively constant during the coating application. Upon release of the combination 1 from the encompassing injection mold, the applied coating 7 readily cools (e.g. within seconds) and solidifies to provide the desired elastomeric protective coating 7 without deforming the protector 5. Since the injection nozzles are prone to clogging upon cooling, the injection molding device should be immediately cleaned of residual TPE.

Alternatively, solvent and aqueous based film formers may be used as elastomeric film formers for the inlay coating. When using liquid vehicles to disperse the elastomeric coating material, the viscosity of the applied elastomeric coating material will typically involve providing a coating material which may then be applied to the viscoelastomeric inlay 5 at a sufficiently low pressure so as to prevent any substantial deformation of the viscoelastomeric inlay 5. As indicated above, a substantial deformation of the viscoelastomeric inlay 5 creates a loss in shock absorbing efficacy because the applied coating 7 tends to retain the viscoelastomeric inlay 5 in its deformed state, and further creates an unsightly consumer product. Since very thin inlays 5 may be effectively used herein, a relatively minor inlay deformation can create a substantial reduction in shock arresting efficacy. Although the most effective viscoelastomeric polymerizates herein possess a high degree of tack so as to tenaciously cling to the applied elastomeric coating 7, the low pressure coating application of the elastomeric coating material prevents protector 5 deformation, which results in a substantially uniform polymeric coating 7 upon the viscoelastomeric protector 5 in its static form.

With particular reference to the Figures, FIG. 1 illustrates a top view of the encasement combination 1 of this invention showing the more critical impact damage zones about the inner rail sections 3A of the encasement 1. In embodiments where the coating 7 is transparent, the actual coating 7 is often not visibly discernable. However, the coated inlay 5 without any visible deformation is evident, such as shown in FIGS. 1 and 3. FIG. 3 depicts an enlarged cross-sectional representation of an inner rim section 3A of the encasement 3 comprising an inlay 5 having a coating 7 disposed thereupon. FIG. 2 depicts a protected cornering inner encasement rim 3A comprising a static inlay 5 coated with a clear elastomeric coating which reveals any undesirable deformation of the inlay 5, while FIG. 3 schematically shows a cross-sectional view of a static inlay 5 coated with an elastomeric coating 7 without any evidence of deformation to the inlay 5. As is evident from the aforementioned, the peripheral corner rim cavity 3C of the electronic encasements 3 shown in FIGS. 1 and 2 presents a particularly acute coating problem when applying the elastomeric overcoating 7 to the inlay 5. As may be further observed in FIGS. 1-3, the inner rim 3A essentially forms a three-sided encasement for the thermoset viscoelastomeric inlay 5, which becomes entrapped upon the covering application of the coating 7 through its open surface location (i.e., its opening). Consequently, the only available displacement region when applying pressure upon the viscoelastomeric inlay 5 exists at the inwardly open rim surface area, which under normal coating techniques, would lead to an entrapped, commercially unattractive and rippled coated inlay. As may be observed from FIGS. 1 and 2, the top surface of the elastomeric coating 7 remains perfectly smooth throughout the inlay's outward-facing surface structure. Thus, by retaining the static thermoset viscoelastomeric inlay structure throughout the overcoating procedure with the elastomer, a highly attractive and undistorted overcoated inlay 5 with an undistorting coating 7 may be effectively accomplished. If desired, the inlay 5 may be slightly dimensionally undercut in width to account for the elastomeric coating 7 and any visually obscured deformation of the inlay 5 during the overcoating procedure. The visually undistorted thermoset viscoelastomeric inlay 5 with its smooth overcoating surface of the elastomeric polymeric overcoating 7 of the combination 1 is illustratively depicted by FIGS. 1 and 2. However, utilization of an improper coating technique will become readily apparent by visual observation of the overcoated inlay.

Although a broad range of coating material may be used herein, the resulting elastomeric coatings 7 will necessarily possess sufficient flexibility to deform and rebound in response to external shock forces arrested by the viscoelastomeric protector 5. The polymeric coating 7 should also possess sufficient durability so as to retain its flexibility and protective elastomeric covering attributes during the useful commercial life of the protective encasement combination 1. The elastomeric overcoating 7 fulfills a further useful purpose by reducing external contaminant accumulation normally attendant to an uncovered viscoelastomeric inlay 5. The polymeric elastomeric overcoatings 7 effectively provide a non-tacky product surface through the use of a non-tacky, film forming, elastomeric plastic coating 7. The tackiness of an uncoated protective inlay 5 also creates an undesirable tacky feel to the ultimate user of the encasement combination 1. These defects are effectively eradicated by the effective elastomeric coating 7 of the protective inlay 5.

The applied polymeric coating 7 must necessarily possess sufficient flexibility so as to harmoniously deform and expand (e.g. reform) with the thermoset viscoelastomeric protective inlay 5 upon exposure to an external impacting force, and then appropriately rebound in harmony with the thermoset viscoelastomeric protector 5 to its static or its native viscoelastomeric form. Thus, the elastomeric polymer coating 7 will function as an integral part of a composite structure of the combination 1 herein by imparting sufficient flexibility to deform and rebound in substantial responsive conformity with the static thermoset viscoelastomeric protector 5. Accordingly, thermoplastic elastomers (e.g., TPE) which are adhesively compatible with the protectors 5 may be effectively used for coating purposes.

Suitable for use as flexible coating materials herein include elastomeric thermoset and thermoplastic materials having sufficient cohesive attraction and flexibility to concurrently respond to volumetric configuration deformation changes which may arise by deforming forces applied to the inlay 5. As indicated above, the polymeric coating 7 may comprise either an elastomeric thermoplastic polymer or elastomeric thermoset polymer overlaying coating. Thermoplastic film-formers having a flexibility that is compatible with the shock absorbing attributes of the thermoset viscoelastomeric protector 5 and the coating thereof are particularly effective for this purpose. Such film-formers are generally recognized in the art as thermoplastic elastomers (TPE), which may be commercially provided in a dissolved or emulsified form, or as a solid. Such thermoplastic elastomers can include polyethylene thermoplastics, thermoplastic polyurethanes (TPU), etc., along with many other protector-compatible elastomeric coating materials. Included amongst the suitable thermosetting coating materials are elastomeric thermosetting film-formers, such as elastomeric thermosets currently used in the ink trade. These thermosetting elastomeric coatings were originally provided as an organic solvent-based dispersion, but due to environmental concerns, are now primarily provided as curable water-based films. Recent advances have led to the omission of heat curing of the thermoset film-formers with the more current curing techniques typically relying upon the use of light sensitive photoelectric initiators to accelerate the curing thereof. The polymeric coating of these printing inks may be formulated to a desired coating color or design. Certain of these printing inks, such as those currently used in the printing industry, may be formulated so as to cure or thermoset in the presence of LED sources. This drastically reduces the energy requirements and the amount of solvent carrier needed to evaporate therefrom to provide the desired polymer coating. Such coatings may eliminate the dyes and/or pigmentation used to create a desired coloring effect. As pointed out earlier, the thermoset or thermoplastic elastomer coatings 7 are applied as coating elastomers in a coatable form (e.g. molten, solvent based, etc.) under low, non-deforming pressures until the elastomer attains its solid elastomeric coating form.

A further alternative involves pre-coated sheets, films or cut-out inserts of the cured thermoset viscoelastomeric material with a coating 7, utilizing non-deforming coating techniques such as those mentioned heretofore, as well as other non-deforming coating techniques, such as low pressure brushing, low pressure flexible rubber squeegees, low pressure fine droplet sprayers, etc. The term "static thermoset viscoelastomeric protector" refers to the protector 5 in its native state without any distortion or deformation of its indigenous state.

Both the thermoplastic and thermoset elastomers may be applied as protective polymeric coatings 7. The thermoplastic and thermoset elastomers may be applied in a molten, solvent or aqueous dispersed form (e.g. emulsified) before curing or after the thermoset protector reaction media has set sufficiently to accept the coating 7 without causing any substantial alteration of the protector's 5 static form. The use of a thermoset elastomer coating 7 affords an opportunity to chemically bond the coating 7 to the thermoset viscoelastomeric protector 5. The protectors 5 and the overlay coating 7 may both be applied to the encasement 3 by injection molding. The uncured thermoset viscoelastomeric reactants may be injected molded onto the encasement 3 and allowed to cure. The curing of the thermosetting reactants upon the encasement surface creates a tenacious chemical bonding which significantly enhances its durability and performance as a shock absorbing protector 5. Chemical bonding between the protector 5 and the encasement 3 is a unique characteristic of a curable thermosetting protector. The viscosity of the thermosetting reactants may be suitably adjusted for injection molding of the inlay 5.

What is claimed is:

1. A protective encasement combination for protecting a stored item against damage caused by an impacting force, said combination comprising:
    A. an encasement for storing items therewithin;
    B. a thermoset viscoelastomeric inlay in a static form positioned within the encasement so as to provide impact damage protection to a stored item against the impacting force; and
    C. an elastomeric coating overcoating the thermoset viscoelastomeric inlay so as to provide an elastomeric coated inlay;

wherein the thermoset viscoelastomeric inlay comprises a cured thermoset reaction product of a reaction media comprising an epoxidized vegetable oil as a predominant reactant by weight, about 20 to about 40 percent by weight of a polyether triol, about 6 to about 12 percent by weight of a polyether diol, about 5 to about 8 percent by weight of a methylene diphenyl isocyanate-based polyether prepolymer, and about 0 to about 10 percent by weight of a bleached vegetable oil; and wherein the reaction media has been reacted in the presence of a catalytic amount of a thermosetting catalyst.

2. The combination according to claim 1 wherein the elastomeric coated inlay is confined within an inner rim section of the encasement.

3. The combination according to claim 2 wherein the elastomeric coated inlay is seated within a cavity section of the inner rim section.

4. The combination according to claim 3 wherein the thermoset viscoelastomeric inlay measures from about 10 mil to about 60 mil in thickness.

5. The combination according to claim 4 wherein the thermoset viscoelastomeric inlay is chemically bonded to the encasement.

6. The combination according to claim 4 wherein the elastomeric coating comprises a thermoset elastomeric polymer substantially free from surface tack.

7. The combination according to claim 4 wherein the elastomeric coating comprises a thermoplastic elastomer.

8. The combination according to claim 4 wherein the thermoset viscoelastomeric inlay measures from about 25 mil to about 50 mil in thickness.

9. The combination according to claim 1 wherein the elastomeric coating is chemically bonded to the thermoset viscoelastomeric inlay by applying the elastomeric coating to the reaction media while the reaction media is thermosetting.

10. The combination according to claim 1 wherein:
A. the epoxidized vegetable oil is present in an amount of about 45 to about 60 percent by weight;
B. the polyether triol has a molecular weight ranging from about 1000 to about 2000;
C. the polyether diol has a molecular weight ranging from about 1000 to about 2000; and
D. the polyether prepolymer is a hydrocarbyl isocyanate present in an amount of about 5 percent to about 8 percent by weight.

11. The combination according to claim 8 wherein the thermoset viscoelastomeric inlay has a thickness ranging from about 35 mil to about 45 mil.

12. The combination according to claim 10 wherein the thermoset viscoelastomeric inlay is chemically bonded to the encasement.

13. A method for making a protective encasement combination for protecting stored items against an impacting force, said method comprising:
A. selecting an encasement for a stored item;
B. providing a cured thermoset viscoelastomeric protector in a static form having impacting force arresting properties, wherein the thermoset viscoelastomeric protector is prepared by curing a thermosetting reaction media comprising an epoxidized vegetable oil as a predominant reactant by weight of the thermosetting reaction media, about 20 to about 40 percent by weight of a polyether triol, about 6 to about 12 percent by weight of a polyether diol, about 5 to about 8 percent by weight of a methylene diphenyl isocyanate-based polyether prepolymer, and about 0 to about 10 percent by weight of a bleached vegetable oil, wherein said thermosetting reaction media is reacted in the presence of a catalytic amount of a thermosetting catalyst, and wherein the thermoset viscoelastomeric protector is disposed within an internal cavity region of the encasement; and
C. surface coating the thermoset viscoelastomeric protector with an elastomeric polymer coating, wherein said surface coating is conducted under coating conditions which substantially retain the static form of the thermoset viscoelastomeric protector.

14. The method according to claim 13 wherein the providing includes installing the thermoset viscoelastomeric inlay within internal cavity sections of a retaining rimmed section of the encasement.

15. The method according to claim 14 wherein the thermoset viscoelastomeric inlay has a thickness measuring from about 10 mil to about 60 mil.

16. The method according to claim 15 wherein the elastomeric polymer coating comprises a thermoset elastomer.

17. The method according to claim 15 wherein the elastomeric polymer coating comprises a thermoplastic elastomer.

18. The method according to claim 14 wherein the thermoset elastomeric inlay measures from about 25 mil to about 50 mil in thickness.

19. The method according to claim 13 wherein:
A. the epoxidized vegetable oil is present in an amount of about 45 to about 60 percent by weight;
B. the polyether triol has a molecular weight ranging from about 1000 to about 2000;
C. the polyether diol has a molecular weight ranging from about 1000 to about 2000; and
D. the polyether prepolymer is a hydrocarbyl isocyanate present in an amount of about 5 to about 8 percent by weight.

20. The method according to claim 19 wherein the surface coating comprises an equalized pressure injection molding of the elastomeric polymer coating onto surface of the thermoset viscoelastomeric inlay.

21. The method according to claim 20 wherein the injection molding comprises injecting a molten thermoplastic elastomer onto the thermoset viscoelastomeric inlay at a sufficiently low pressure to retain the static form of the thermoset viscoelastomeric inlay.

22. The method according to claim 19 further comprising applying the thermosetting reaction media by injection molding to the encasement and thereafter allowing the reaction media to cure in situ and thereby chemically bonding the thermoset viscoelastomeric inlay to the encasement.

23. The method according to claim 19 wherein the elastomeric polymer coating comprises a thermoset elastomer.

* * * * *